United States Patent
Hagiya et al.

(10) Patent No.: US 7,889,224 B2
(45) Date of Patent: Feb. 15, 2011

(54) OPTICAL PATH SWITCHING DEVICE, OPTICAL SCANNING DEVICE, AND IMAGE FORMING APPARATUS

(75) Inventors: Toshimichi Hagiya, Chiba (JP); Kazuya Miyagaki, Kanagawa (JP); Atsushi Takaura, Tokyo (JP); Toshiaki Tokita, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 323 days.

(21) Appl. No.: 12/204,361

(22) Filed: Sep. 4, 2008

(65) Prior Publication Data
US 2009/0080907 A1   Mar. 26, 2009

(30) Foreign Application Priority Data
Sep. 21, 2007   (JP)   ............... 2007-245223

(51) Int. Cl.
*B41J 27/00*    (2006.01)
*B41J 2/385*    (2006.01)
*B41J 15/14*    (2006.01)

(52) U.S. Cl. ............... 347/261; 347/129; 347/132; 347/134; 347/135; 347/137; 347/237; 347/238; 347/239; 347/241; 347/243; 347/244; 347/255; 347/256; 347/258; 347/259; 347/260; 359/496; 359/497

(58) Field of Classification Search ............ 347/129, 347/132, 134, 135, 137, 238, 239, 241, 243, 347/244, 255, 256, 258, 259, 260, 261; 359/496, 359/497
See application file for complete search history.

(56) References Cited

U.S. PATENT DOCUMENTS 5,113,279 A * 5/1992 Hanamoto et al. ....... 359/196.1
5,371,608 A * 12/1994 Muto et al. ................. 358/412
5,753,907 A * 5/1998 Nakajima et al. ........... 250/234
5,786,594 A * 7/1998 Ito et al. ..................... 250/236

(Continued)

FOREIGN PATENT DOCUMENTS
JP    8-118726    5/1996

(Continued)

OTHER PUBLICATIONS

Mori et al, "Low-switching-energy and high-repetition-frequency all-optical flip-flop operations of a polarization bistable vertical-cavity surface-emitting laser", Applied Physics Letters 88, pp. 101102-1-101102-3, 2006.

(Continued)

Primary Examiner—Ryan Lepisto
(74) Attorney, Agent, or Firm—Dickstein Shapiro LLP

(57) ABSTRACT

A disclosed optical path switching device includes a polarization bistable VCSEL that emits a beam having a rising polarization plane, a laser light source configured to emit a beam having a polarization plane orthogonal to the rising polarization plane, and an optical path switching unit configured to switch an optical path of the beam emitted from the polarization bistable VCSEL by switching the angle of the rising polarization plane of the beam emitted from the polarization bistable VCSEL. The beam emitted from the polarization bistable VCSEL is incident on an entrance window of the optical path switching unit, and the beam emitted from the laser light source is incident on an exit window of the polarization bistable VCSEL.

9 Claims, 9 Drawing Sheets

U.S. PATENT DOCUMENTS

| | | | | |
|---|---|---|---|---|
| 6,108,501 | A * | 8/2000 | Nagai | 399/116 |
| 6,330,020 | B1 * | 12/2001 | Kamioka | 347/241 |
| 6,690,404 | B2 * | 2/2004 | Shimada et al. | 347/115 |
| 6,775,041 | B1 * | 8/2004 | Nakajima | 359/204.1 |
| 7,075,688 | B2 * | 7/2006 | Nakajima | 359/204.1 |
| 7,236,280 | B2 * | 6/2007 | Makino | 359/204.1 |
| 2001/0035999 | A1 * | 11/2001 | Saito et al. | 359/204 |
| 2005/0099663 | A1 | 5/2005 | Hayashi | |
| 2006/0256183 | A1 * | 11/2006 | Masuda | 347/233 |
| 2007/0146738 | A1 * | 6/2007 | Nakajima | 358/1.4 |

FOREIGN PATENT DOCUMENTS

| | | |
|---|---|---|
| JP | 2001-83452 | 3/2001 |
| JP | 2002-23085 | 1/2002 |

OTHER PUBLICATIONS

Hitoshi Kawaguchi, "Application of VCSEL to All-optical Signal Processing", O plus E, vol. 29, No. 4, pp. 343-347, Apr. 2007.

* cited by examiner

OPTICAL PATH SWITCHING DEVICE, OPTICAL SCANNING DEVICE, AND IMAGE FORMING APPARATUS

BACKGROUND OF THE INVENTION

1. Field of the Invention

The present invention relates to an optical scanning device and an image forming apparatus for use in laser printers, digital copiers, plain paper facsimile machines, and the like.

2. Description of the Related Art

More and more electrophotographic image forming apparatuses for use in laser printers, digital copiers, plain paper facsimile machines, and the like now provide color and high-speed printing, and tandem type image forming apparatuses having plural photoreceptors (typically, four photoreceptors) have become common. There are electrophotographic image forming apparatuses that have only one photoreceptor and are configured to rotate the photoreceptor the same number of times as the number of colors (e.g., in the case of four colors and one drum, the drum needs to be rotated four times). These color electrophotographic image forming apparatuses of this type are slow in copying speed. On the other hand, the tandem type image forming apparatuses have an increased number of light sources, resulting in an increase in the number of component parts, color shift due to the difference between wavelengths of the plural light sources, and higher costs. Furthermore, degradation of a semiconductor laser causes a writing unit to malfunction. The higher the number of the light sources, the higher the risk of malfunction. Especially, in the case where VCSELs or edge emitting LD array is used as the light source, the risk of malfunction is increased.

FIGS. 8A-8C are diagrams each illustrating a part of a related-art optical scanning device. FIG. 8A illustrates a two-stage rotating polygon mirror 1. FIG. 8B illustrates a method of making a beam from a single light source 2 incident on both stages 1a and 1b (upper and lower portions 1a and 1b) of the rotating polygon mirror 1. FIG. 8C illustrates a specific example of a beam splitter 4.

Referring to FIGS. 8A-8C, reference numeral 1 denotes the two-stage rotating polygon mirror (hereinafter referred to simply as a "polygon mirror") that includes phase-shifted upper and lower reflective surfaces 1a and 1b (upper and lower portions 1a and 1b); 2 denotes the light source for writing; 3 denotes a collimator lens; 4 denotes the beam splitter; and L, L1, and L2 denote beams.

Reference numeral 4a denotes a semitransparent mirror; 4b denotes a total reflection mirror; 4-1 denotes a triangular prism; 4-2 denotes a parallelogram prism, 4-2a denotes an entrance window; and 4-1b and 4-2b denote exit windows.

In FIGS. 8A-8C, the vertical direction of the paper may be called a sub scanning direction, and the direction perpendicular to the paper may be called a main scanning direction.

An optical scanning device having a reduced number of light sources and capable of outputting images at high speed as shown in FIGS. 8A-8C is disclosed in Patent Document 1, for example. This optical scanning device is configured to split a beam of a common light source into plural beams and make the beams incident on different stages of a reflection mirror to scan different scanning surfaces.

In FIGS. 8A-8C, a beam L is emitted from the light source 2, is collimated by the collimator lens 3, and becomes incident on the beam splitter 4. The beam splitter 4 may employ various techniques based on different principles. Typically, a half mirror prism using the semitransparent mirror 4a as shown in FIG. 8C is used. The half mirror prism (beam splitter) 4 is formed by boding a side surface of the triangular prism 4-1 and a surface of the parallelogram prism 4-2 with the semitransparent mirror 4a.

The beam L that has become incident on the entrance window 4-2a and passed through the semitransparent mirror 4a becomes a beam L1 having half the power of the beam L. The beam L1 goes straight to come out of the exit window 4-1b and becomes incident on the upper reflective surface (upper portion) 1a of the polygon mirror 1. The beam L that is reflected by the semitransparent mirror 4a becomes a beam L2 having half the power of the beam L and is reflected to the total reflecting mirror 4b disposed at the lower side. The beam L2 is made parallel to the original beam L by the total reflecting mirror 4b, comes out of the exit window 4-2b, and becomes incident on the lower reflective surface (lower portion) 1b of the polygon mirror 1.

The upper and lower portions 1a and 1b of the polygon mirror 1 are arranged with a phase difference, i.e., an angular difference $\theta$. In this example, the angular difference $\theta$ between the upper and lower portions 1a and 1b of the four-faced polygon mirror 1 is 45 degrees.

Although not shown, a cylindrical lens having power in the sub scanning direction is disposed between the light source 2 and the polygon mirror 1. Further, although not shown, an imaging optical system that focuses the scanning light from the polygon mirror 1 onto the scanning surface, i.e., a photoreceptor is provided.

FIGS. 9A and 9B are diagrams illustrating problems with lights reflected by the upper and lower portions 1a and 1b, respectively, of the polygon mirror 1. FIG. 9A illustrates the case where the beam L1 incident on the upper portion 1a of the polygon mirror 1 scans a first photoreceptor (not shown). FIG. 9B illustrate the case where the beam L2 incident on the lower portion 1b of the polygon mirror 1 scans a second photoreceptor (not shown).

According to this configuration, while the upper beam L1 scans the surface (scanning surface) of the first photoreceptor, the lower beam L2 is preferably blocked by a light shielding member to prevent the beam L2 from reaching the scanning surface of the first photoreceptor. On the other hand, while the lower beam L2 scans the surface (scanning surface) of the second photoreceptor, the upper beam L1 is blocked to prevent the beam from reaching the scanning surface of the second photoreceptor. That is, the beam L1 and the beam L2 are alternately used. Accordingly, modulation driving of the light source 2 is performed at different timings for the upper portion 1a and the lower portion 1b. More specifically, during scanning of the first photoreceptor corresponding to the upper portion 1a, the modulation driving of the light source 2 is performed based on image information of a color (e.g., black) corresponding to the upper portion 1a. During scanning of the second photoreceptor corresponding to the lower portion 1b, the modulation driving of the light source 2 is performed based on image information of a color (e.g., magenta) corresponding to the lower portion 1b.

In this system, because, for example, the semitransparent mirror 4a is used, the beam of the common light source 2 is split into two beams so that the power of each of the beams has about half the power of the beam before splitting, and thus the actual efficiency of the light source power is reduced. Therefore this system requires twice the power of a system using plural light sources or greater. Increasing the power leads to degradation of the light source 2, which may cause a writing unit to malfunction.

Although not described in detail, a combination of diffractive optical elements may be used as the beam splitter 4 for splitting the beam from the common light source 2 in place of the half mirror prism.

FIGS. 10 and 11 are timing charts of light emission wherein a single light source is used for scanning for two colors.

In the examples shown in FIGS. 10 and 11, light emission is performed for black and magenta.

In FIGS. 10 and 11, the solid lines indicate exposure for black and the dotted lines indicate exposure for magenta. Each waveform indicates exposure for one scanning line. The timing of starting writing is determined by detection of a scanning beam by a synchronous light receiving unit (not shown), which is disposed outside the effective scanning width. A photo diode is typically used as the synchronous light receiving unit.

In FIG. 10, the light intensity for the area of black is the same as the light intensity for the area of magenta. However, because optical elements relatively differ in transmittance and reflectance, if the light intensity of the light source for the area of black is the same as that for the area of magenta, the light intensity of the beam that reaches the photoreceptor for black differs from the light intensity of the beam that reaches the photoreceptor for magenta. To avoid such a problem, as shown in FIG. 11, different light intensities are used for scanning different photoreceptor surfaces, thereby equalizing the light intensities of the beams that reach the different photoreceptor surfaces.

FIG. 12 is a diagram illustrating a light emitting surface of a VCSEL (vertical-cavity surface-emitting laser) 21 as an example of a multibeam array.

In FIG. 12, reference numerals 20 and 21 indicate the VCSEL (see Non-Patent Document 1) and light emitters, respectively.

In the example of FIG. 12, there are provided 10 light emitting points in the horizontal direction by 4 light emitting points in the vertical direction, a total of 40 light emitting points. The light emitting points are disposed in slightly different positions from each other with respect to the end face of a substrate such that the 40 beams are spaced at the same interval upon drawing using multibeam wherein the horizontal direction is the main scanning direction.

Each light emitting point is formed in a square having sides parallel to the end face of the substrate, and a polarization plane is formed in the direction of these sides.

Such a light source is very expensive, and it is not preferable to use a large number of such light sources in view of the cost. As long as the optical system as described above is used, beam power loss is inevitable. To cover the power loss, it is necessary to increase the output of the light source or increase the number of light sources.

<Patent Document 1> Japanese Patent Laid-Open Publication No. 2005-92129 (corresponding to U.S. Patent Application Publication No. 2005/0099663A1)

<Non-Patent Document 1> Takashi Mori, Yasuhiro Yamayoshi, and Hitoshi Kawaguchi "Low-switching-energy and high-repetition-frequency all-optical flip-flop operations of a polarization bistable vertical-cavity surface-emitting laser" APPLIED PHYSICS LETTERS 88, 101102, 2006.

SUMMARY OF THE INVENTION

The present invention is directed toward providing a low-cost, high-image-quality, and high-speed optical scanning device that has a reduced number of VCSEL light sources, prevents beam power loss, and enables high-speed image output by high-speed optical path switching; and a multicolor image forming apparatus using the optical scanning device.

In an embodiment of the present invention, there is provided an optical path switching device that includes a polarization bistable VCSEL that emits a beam having a rising polarization plane, a laser light source configured to emit a beam having a polarization plane orthogonal to the rising polarization plane, and an optical path switching unit configured to switch an optical path of the beam emitted from the polarization bistable VCSEL by switching the angle of the rising polarization plane of the beam emitted from the polarization bistable VCSEL. The beam emitted from the polarization bistable VCSEL is incident on an entrance window of the optical path switching unit, and the beam emitted from the laser light source is incident on an exit window of the polarization bistable VCSEL.

In another embodiment of the present invention, there is provided an optical scanning device that includes the above-described optical path switching device, a two-stage polygonal reflector, and two scanning surfaces that are alternately scanned.

In another embodiment of the present invention, there is provided an image forming apparatus that includes the two optical scanning devices; four sets of a charging unit, a developing unit, and a transfer unit corresponding to the four scanning surfaces; and a fixing unit. The four scanning surfaces are four photoreceptors, and images are formed on the four scanning surfaces.

In another embodiment of the present invention, there is provided an image forming apparatus that includes the two optical path switching devices; a two-stage polygonal reflector; four photoreceptors as four scanning surfaces; four sets of a charging unit, a developing unit, and a transfer unit corresponding to the four photoreceptors; and a fixing unit.

According to an aspect of the present invention, it is possible to provide a low-cost and high-image-quality optical scanning device that has a reduced number of expensive VCSEL light sources, prevents beam power loss, and enables high-speed image output; and a multicolor image forming apparatus using the optical scanning device.

DETAILED DESCRIPTION OF THE PREFERRED EMBODIMENT

Figure 1:
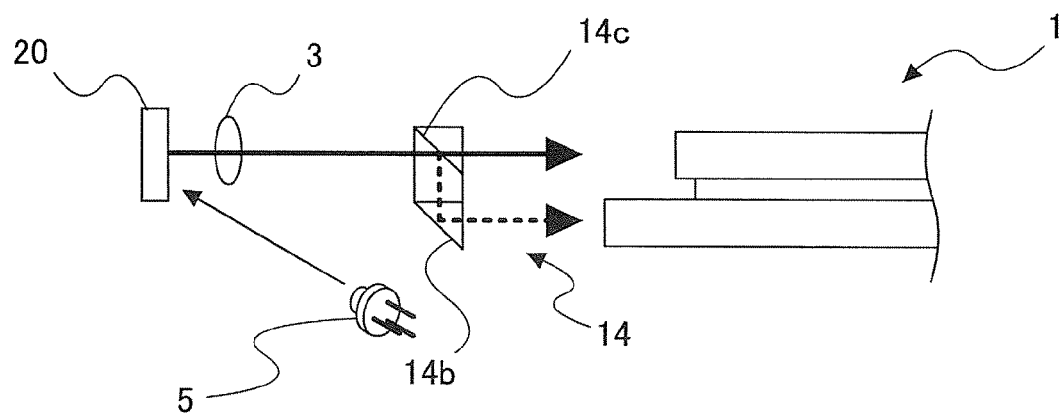
FIG. 1 is a diagram illustrating an embodiment of the present invention.

FIG. 1 is a diagram illustrating an embodiment of the present invention.

In FIG. 1, reference numeral 5 denotes a laser light source that emits polarized light having a polarization plane in a certain direction; 14 denotes an optical path switching unit; and 20 denotes a VCSEL as the light source. Reference numerals 14c and 14b denote a polarizing beam splitter (PBS) and a total reflection mirror, respectively. Other reference numerals are described below with reference to FIG. 5.

Figure 2:
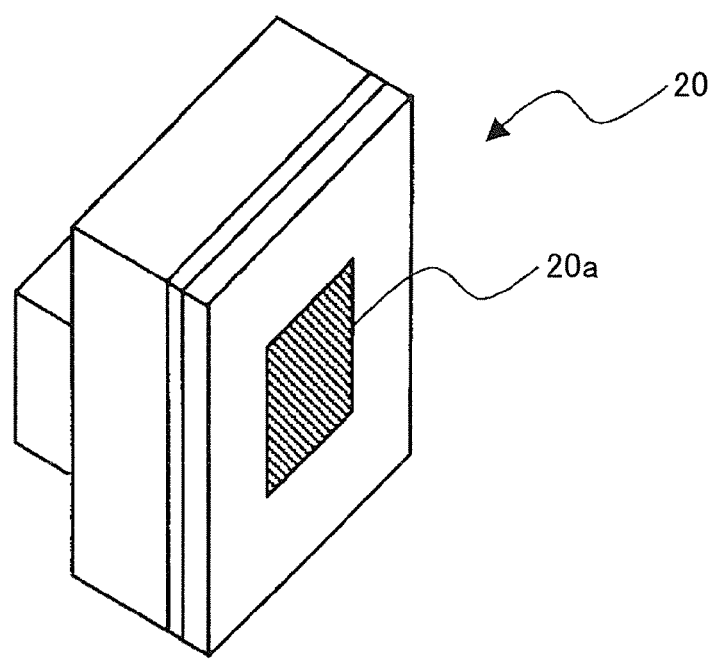
FIG. 2 is a perspective view illustrating a VCSEL.

FIG. 2 is a perspective view illustrating the VCSEL 20.

In FIG. 2, reference numeral 20a denotes a laser light exit window.

The properties of a typical VCSEL are briefly described below.

The typical VCSEL emits light with a polarization plane in a certain direction. This polarization plane in the certain direction is referred to as a "rising polarization plane" for explanation purposes. To facilitate understanding of the present embodiment, the beam having the rising polarization plane is described as being s-polarized with respect to the PBS 14c.

If p-polarized external light having a polarization plane different by 90 degrees from the rising polarization plane becomes incident on the light emitting point during light emission, the outgoing light is immediately switched to p-polarized light parallel to the polarization plane of incidence. If the VCSEL continues to emit light, the switched polarization plane is retained even if the external light is blocked. If the VCSEL stops light emission and then starts light emission again with no external light incident on the light emitting point, the emitted beam has the rising polarization plane. That is, the light is s-polarized as initially was. In the case where s-polarized external light is incident when light emission is started, no change occurs and the emitted light has the rising polarization plane. This characteristic is called polarization bistability.

If the VCSEL 20 is lighted up with p-polarized light incident on the VCSEL 20, although the VCSEL 20 initially emits s-polarized light, the light is immediately switched to p-polarized light when the light emission level reaches a predetermined level. In this case, the period of time that the light is s-polarized is very short and can be ignored depending on the intended use. The energy level of the external light required to switch the polarization plane of the VCSEL 20 is very low and irradiation time of the external light is as little as 7 ps (reference: O plus E). The wavelength of the external light basically needs to be the same as or very close to the emission wavelength. Because the basic structure of the VCSEL is a semiconductor laser, the emission wavelength slightly fluctuates depending on the condition such as heat generation. Therefore, it is difficult to match the wavelength of the external light and the emission wavelength of the VCSEL if the incident external light has a single wavelength. On the other hand, because the external light is laser light, the stability of its emission wavelength can be a problem.

The optical path switching device shown in FIG. 1 is configured to use these properties of the VCSEL.

The laser light source 5 has an emission wavelength comparable to the emission wavelength of the VCSEL 20 and is arranged to emit light having a polarization plane orthogonal to the polarization plane of the VCSEL 20 onto the VCSEL 20.

In this embodiment, the polarization plane of the VCSEL 20 is aligned with the horizontal plane to emit s-polarized light with respect to the PBS 14c and is described as being at 0 degrees in terms of the angle with respect to the horizontal plane. Accordingly, the polarization plane of the laser light source 5 is described as being at 90 degrees.

With this configuration, if the VCSEL 20 is turned on without turning on the laser light source 5, the laser light emitted form the VCSEL 20 is an s-polarized light of 0 degrees in the polarization direction and is reflected by the surface of the PBS 14c. On the other hand, if the VCSEL 20 is turned on while turning on the laser light source 5, the laser light emitted form the VCSEL 20 is a p-polarized light of 90 degrees in the polarization direction and passes through the surface of the PBS 14c.

The polarization direction of the laser light emitted from the VCSEL 20 is alternately switched by repeatedly turning on and off the laser light source 5, so that the laser light is alternately reflected and transmitted through the surface of the PBS 14c. In this way, the optical path of the light emitted from the VCSEL 20 can be switched in the optical path switching unit 14. In terms of this function, the beam splitter 4 of FIG. 8 corresponds to the optical path switching unit 14 of FIG. 1.

This configuration enables switching the optical path of the light emitted from the expensive VCSEL light source using the inexpensive laser light source 5 at high speed and can be used for optical path switching in optical communications and optical systems for optical scanning.

Figure 3:
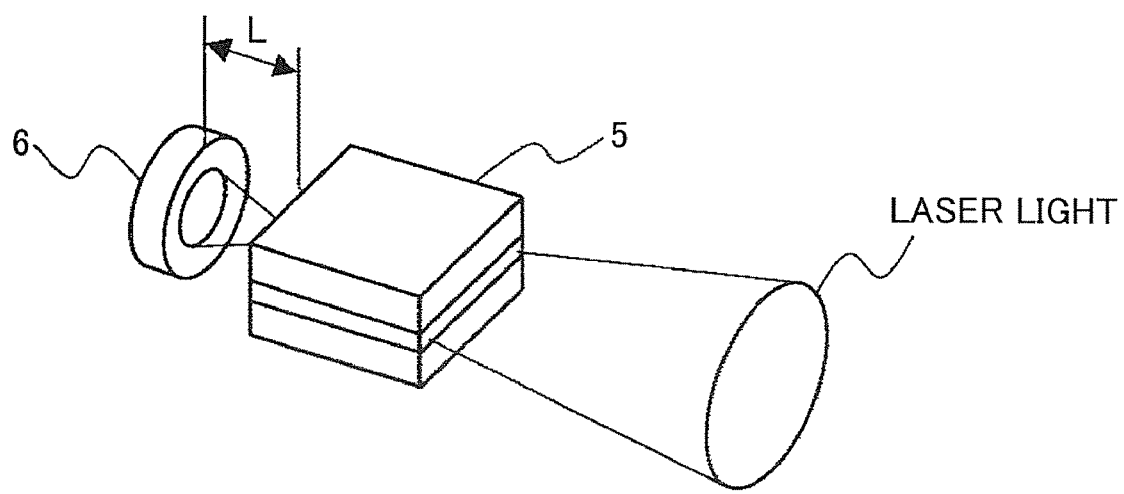
FIG. 3 is a schematic diagram illustrating an external resonator type semiconductor laser light source.

FIG. 3 is a schematic diagram illustrating an external resonator type semiconductor laser light source.

Figure 6:
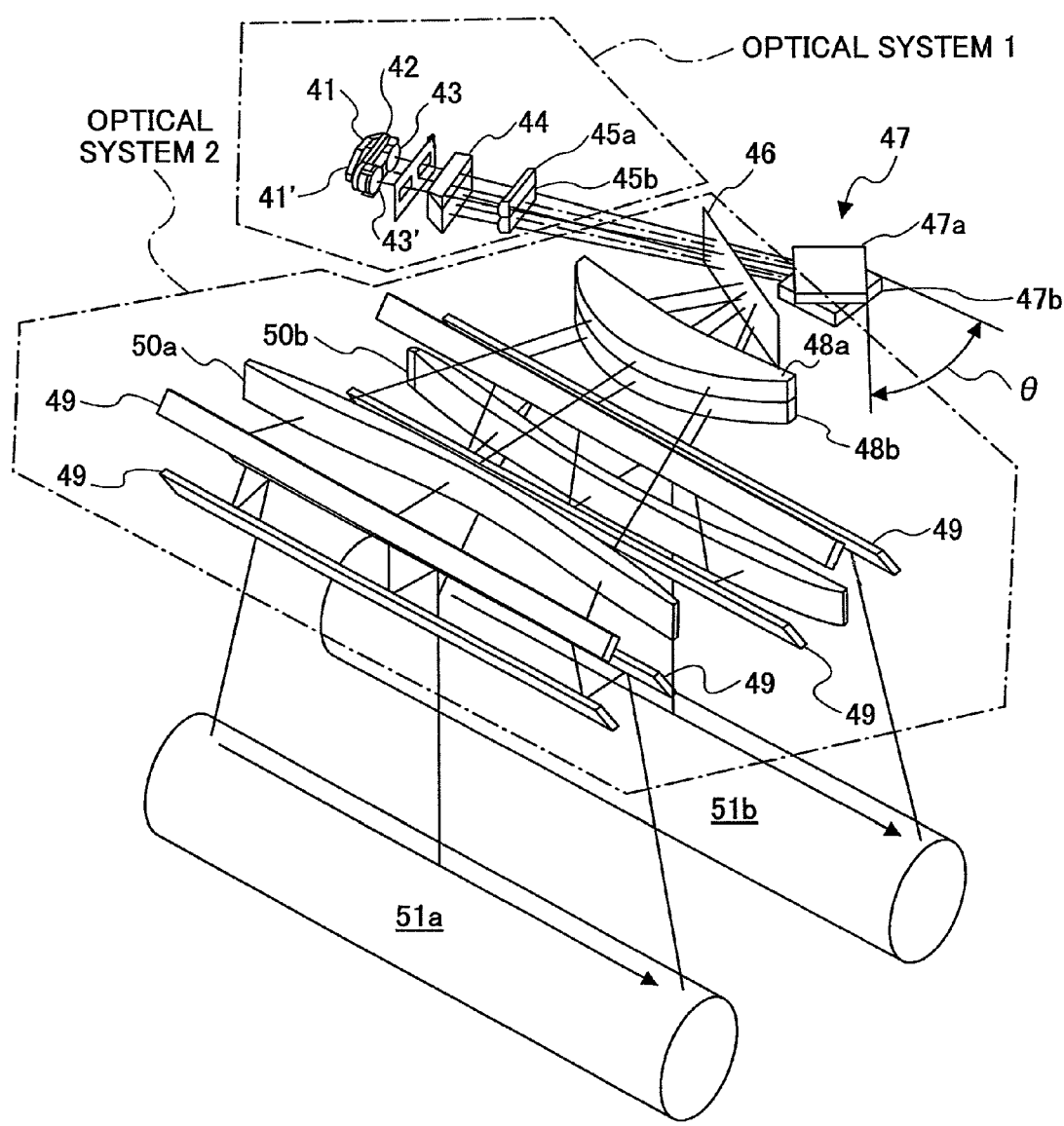
FIG. 6 is a schematic diagram illustrating an optical scanning device using an optical path switching device.

In FIG. 6, reference numeral 6 denotes a concave mirror as an external resonator.

According to Non-Patent Document 1, a typical polarization bistable VCSEL has a narrow band of polarization direction switching sensitivity wavelengths. Therefore, the laser light incident on the VCSEL needs to have an accurate wavelength. However, inexpensive edge emitting semiconductor lasers greatly vary in wavelength and often cannot emit light within the band of polarization direction switching wavelengths of the VCSEL.

If a well known external resonator type semiconductor laser as shown in FIG. 3 is used as the light source 5 in the optical path switching device of FIG. 1, the wavelength of the laser light emitted to the VCSEL 20 can be controlled by varying a distance L between the laser light source 5 and the concave mirror 6. This enables accurately switching the polarization of the bistable VCSEL at high speed and accurately switching the optical path at high speed in optical communications and optical systems for optical scanning.

Figure 4:
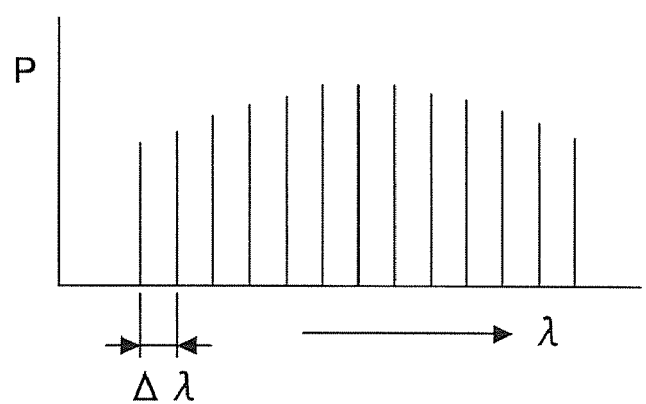
FIG. 4 is a chart illustrating lasing wavelengths of a laser light source on which a high-frequency wave is superposed.

FIG. 4 is a chart illustrating lasing wavelengths of a laser light source on which a high-frequency wave is superposed.

In the above embodiment, because the band of the polarization switching sensitivity wavelengths of the VCSEL is narrow, the external resonator type laser is used in order to achieve the band. In this case, a monitor (not shown) for monitoring the wavelength of the VCSEL and a circuit (not shown) for controlling the wavelength of the external resonator type laser according to the wavelength of the VCSEL are necessary.

If a well known high frequency superposing circuit is provided in a controller for oscillating the laser light source, the light emitted from the laser light source has multiple slightly different wavelengths as shown in FIG. 4. The interval ($\Delta\lambda$ in FIG. 4) between the adjacent lasing wavelengths can be controlled by the frequency of the superposed high frequency wave. The center wavelength of the laser light source is substantially the same as the average lasing wavelength of the VCSEL, and $\Delta\lambda$ is less than the polarization switching sensitivity band of the VCSEL, so that one or more of the wavelengths of the light emitted from the laser light source fall in the polarization switching sensitivity band of the VCSEL, thereby enabling polarization switching.

Thus, it is possible to switch the polarization direction of the VCSEL at lower cost than in the case where the external resonator type semiconductor laser is used.

Figure 5:
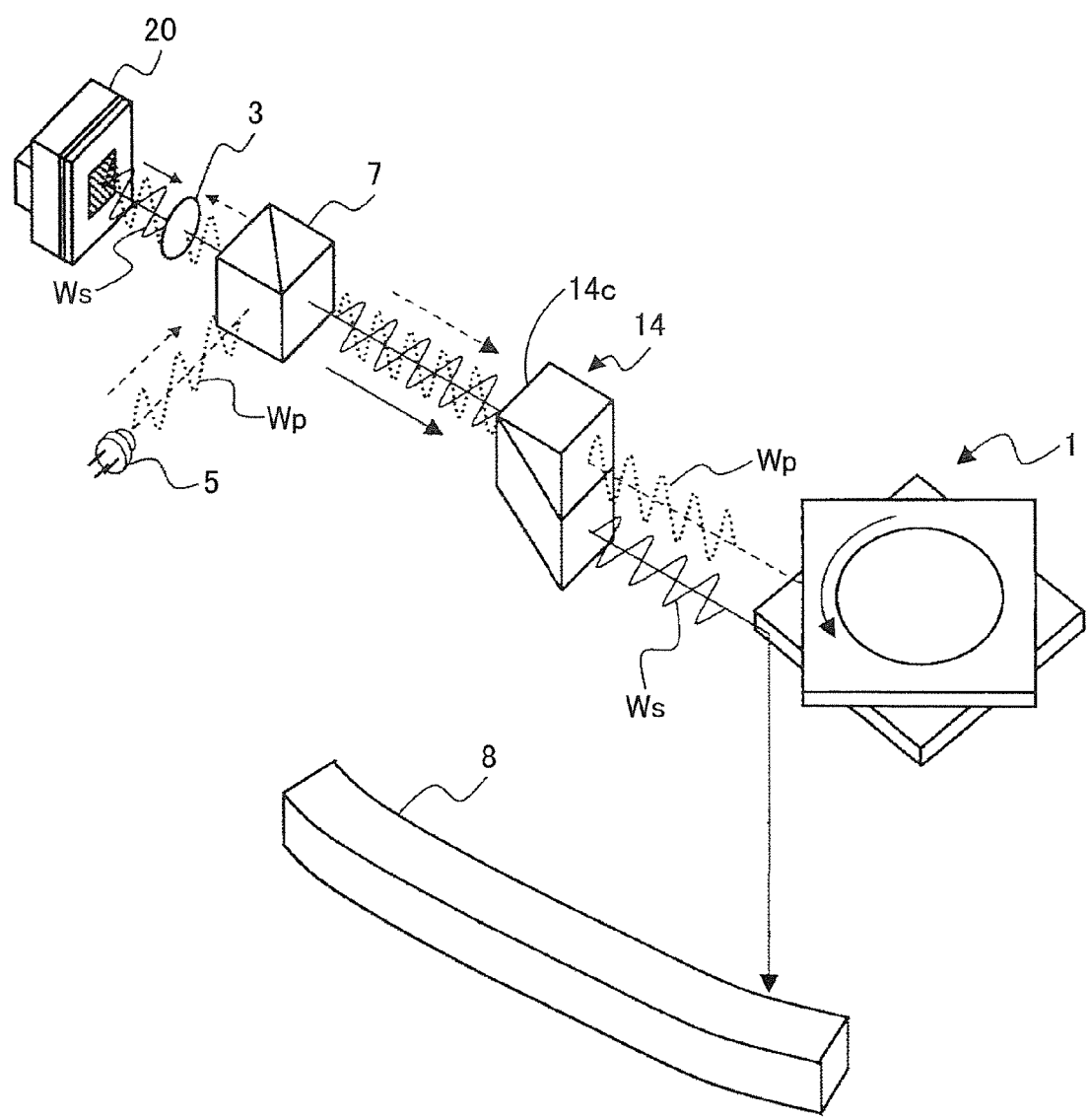
FIG. 5 is a schematic diagram illustrating an optical path switching device using a polarization bistable VCSEL.

FIG. 5 is a schematic diagram illustrating an optical path switching device using a polarization bistable VCSEL.

In FIG. 5, reference numeral 14 denotes an optical path switching unit; 7 denotes a half mirror prism; and 8 denotes an fθ lens. Further, Ws and Wp denote an s-polarized light and a p-polarized light, respectively, with respect to the optical path switching unit 14.

In the optical path switching device of FIG. 5, the half mirror prism 7 having a half mirror surface at an angle of 45 degrees relative to the optical axis of the polarization bistable VCSEL 20 is disposed on the optical axis of the polarization bistable VCSEL 20. The laser light source 5 is disposed on a second optical path crossing at right angles to the optical axis of the polarization bistable VCSEL 20 on the half mirror surface. The optical path switching unit 14 uses the optical beam splitter (PBS) 14c.

The half mirror prism 7 has a transmittance of 90% or greater and directs several percentages of the light of the laser light source 5 to the polarization bistable VCSEL 20.

If the polarization bistable VCSEL 20 emits the laser light Ws (waveform shown by the solid line of FIG. 5) polarized in a 0-degree direction (i.e., s-polarized light with respect to the PBS), the laser light source 5 emits the laser light Wp (waveform shown by the dotted line) polarized in a 90-degree direction (i.e., p-polarized light), and several percentages of the light Wp is reflected by the half mirror prism 7, passes through the polarization bistable VCSEL 20, and is incident on the polarization bistable VCSEL 20. Thus, the polarization direction of the laser light emitted from the polarization bistable VCSEL 20 is switched from the s-polarized light Ws to the p-polarized light Wp in a 90-degree polarization direction. Since the laser light Wp is p-polarized with respect to the PBS 14c of the optical path switching unit 14, the light Wp passes through the PBS 14c and is directed to the upper portion 1a of the polygon mirror 1. In this case, the upper portion 1a of the polygon mirror 1 is located so that the laser light can be scanned onto the corresponding scanning surface, i.e., the corresponding photoreceptor (not shown) via the fθ lens 8. Under this condition, even if the VCSEL 20 is turned off, if the VCSEL 20 is turned on again, the VCSEL 20 emits substantially p-polarized light except during a transitional period.

Next, the laser light source 5 is turned off, and the VCSEL 20 is also turned off. Then, if the VCSEL 20 is turned on without turning on the laser light source 5, the polarization bistable VCSEL 20 emits the light Ws in the 0-degree polarization direction. Since the laser light Ws is s-polarized with respect to the PBS 14c of the optical path switching unit 14, the light Ws is reflected downward by the PBS 14c, is turned 90 degrees by the total reflection mirror 14b disposed at the lower side, and is directed to the lower portion 1b of the polygon mirror 1. Similar to the above case, the lower portion 1b of the polygon mirror 1 is located so that the laser light can be scanned onto the corresponding scanning surface, i.e., the corresponding photoreceptor (not shown). Although the VCSEL 20 is turned on and off according to image information, the light emitted from the VCSEL 20 is always s-polarized and therefore is directed to the lower portion 1b of the polygon mirror 1 after passing through the optical path switching unit 14.

The polygon mirror 1 continuously rotates at high speed. When the upper portion 1a of the polygon mirror 1 comes to the position that allows scanning the corresponding photoreceptor, the laser light source 5 is turned on. In response, light emission by the multibeam VCSEL 20 is started. Although light emission by the multibeam VCSEL 20 is started, the multibeam VCSEL 20 is repeatedly turned on and off for each beam or for each pixel according to image information.

When one scanning operation by the upper portion 1a is completed, the laser light source 5 is turned off. When the lower portion comes to the position that allows scanning, the laser light source 5 stays off.

According to the configuration described above, the laser light emitted from the laser light source 5 for switching the polarization direction of the polarization bistable VCSEL 20 can be incident on the laser light emitting surface of the polarization bistable VCSEL 20 at right angles.

Therefore, in the case where the polarization bistable VCSELs 20 has arrays of light emitting points, because the laser beam for switching the polarization direction can be uniformly irradiated, it is possible to perform a stable switching operation and improve the reliability of the device.

If the optical path switching device of this embodiment of the present invention using the polarization stable VCSEL 20 is employed in a related-art optical scanning device including the polygon mirror 1, the laser light emitted from the polarization bistable VCSEL 20 can be effectively used.

Figure 8A:
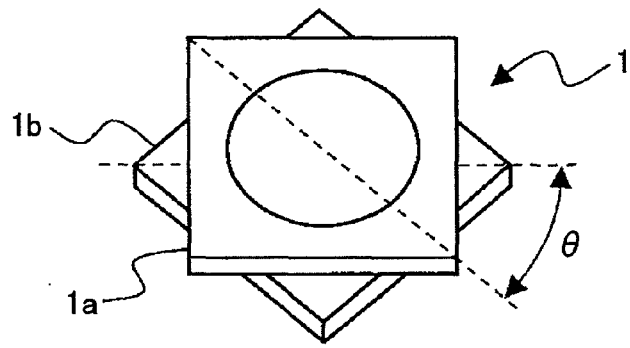
FIGS. 8A-8C are diagrams each illustrating a part of a related-art optical scanning device.
Figure 8B:
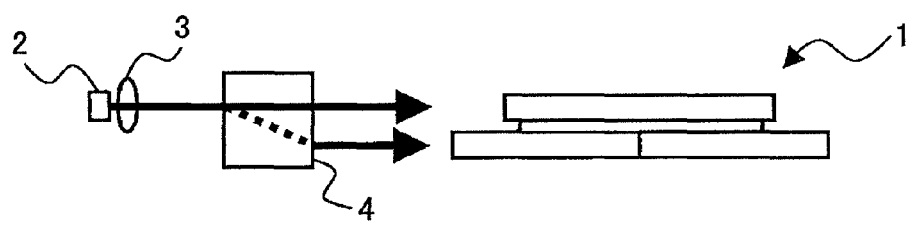
Figure 8C:
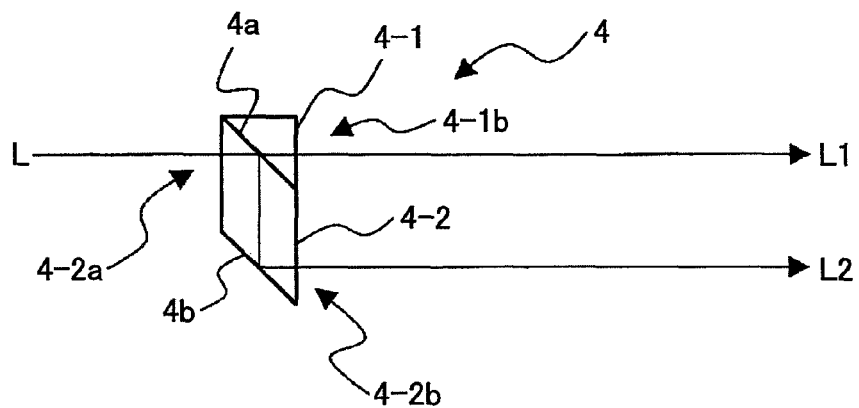
Figure 9A:
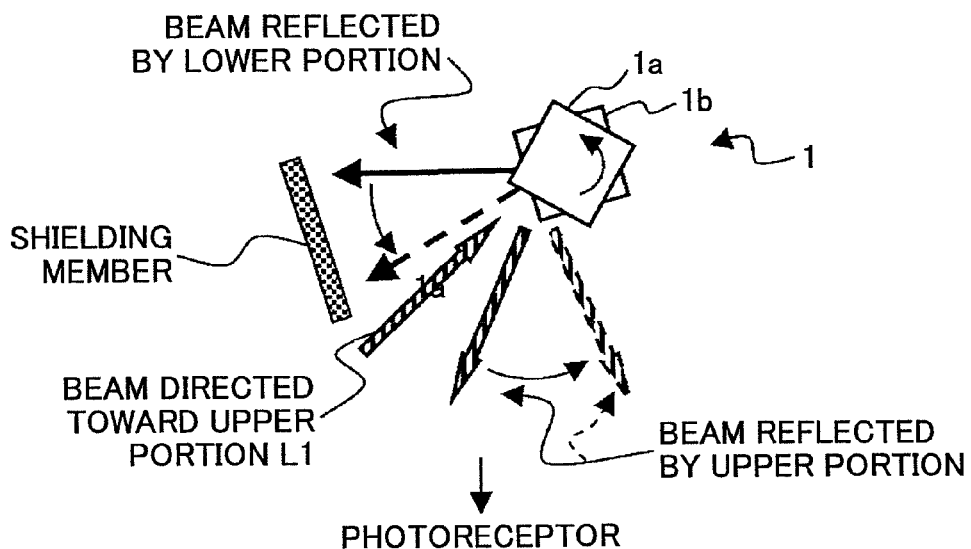
FIGS. 9A and 9B are diagrams illustrating problems with lights reflected by upper and lower portions, respectively, of a polygon mirrors.
Figure 9B:
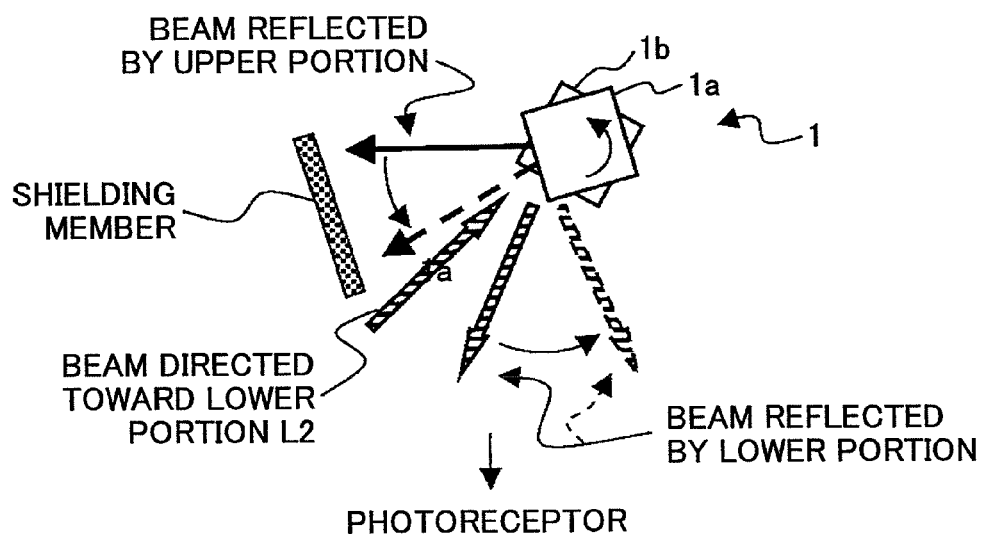
Figure 10:
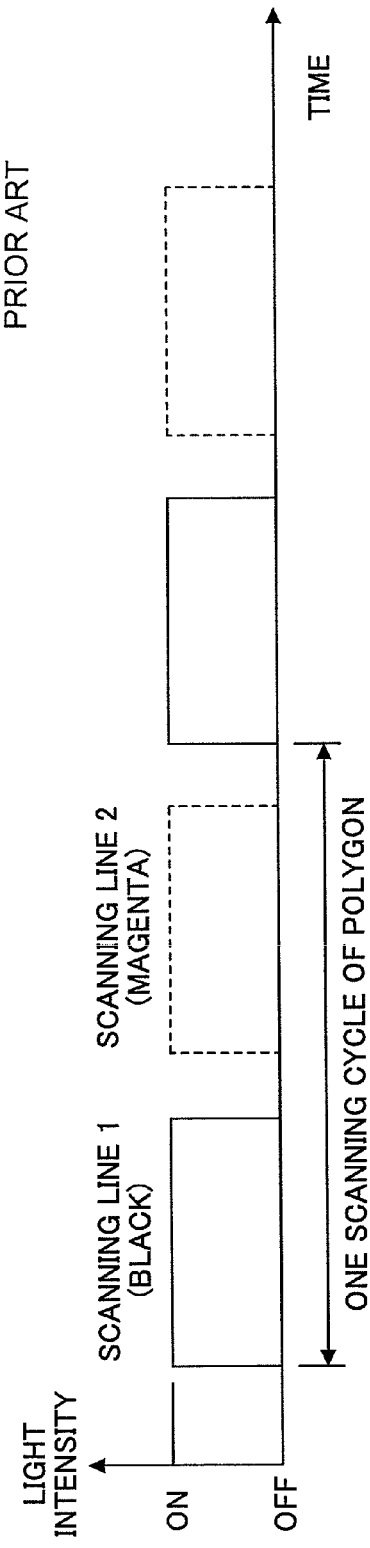
FIG. 10 is a timing chart of light emission wherein a single light source is used for scanning for two colors.
Figure 11:
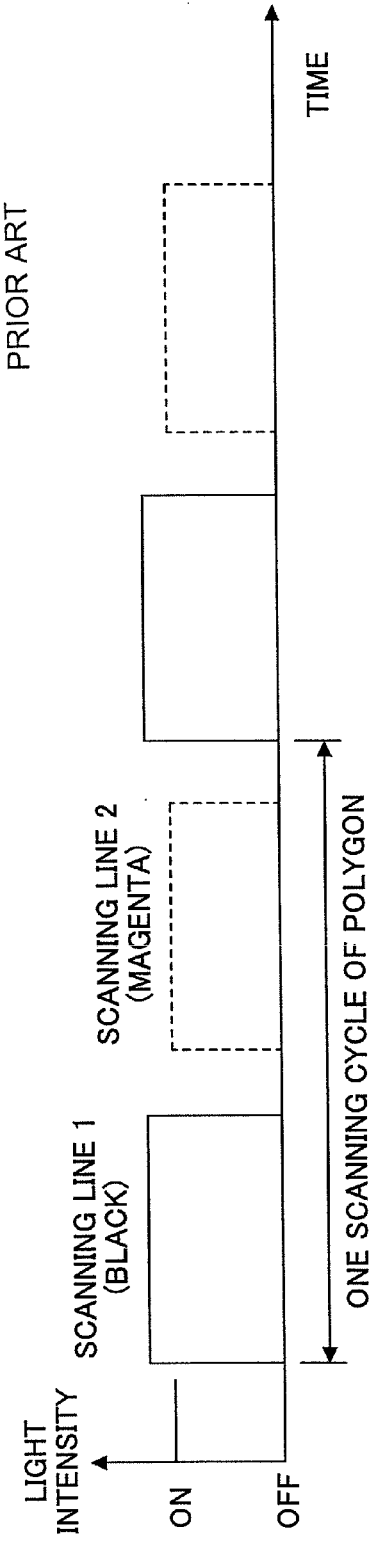
FIG. 11 is a timing chart of light emission wherein a single light source is used for scanning for two colors.
Figure 12:
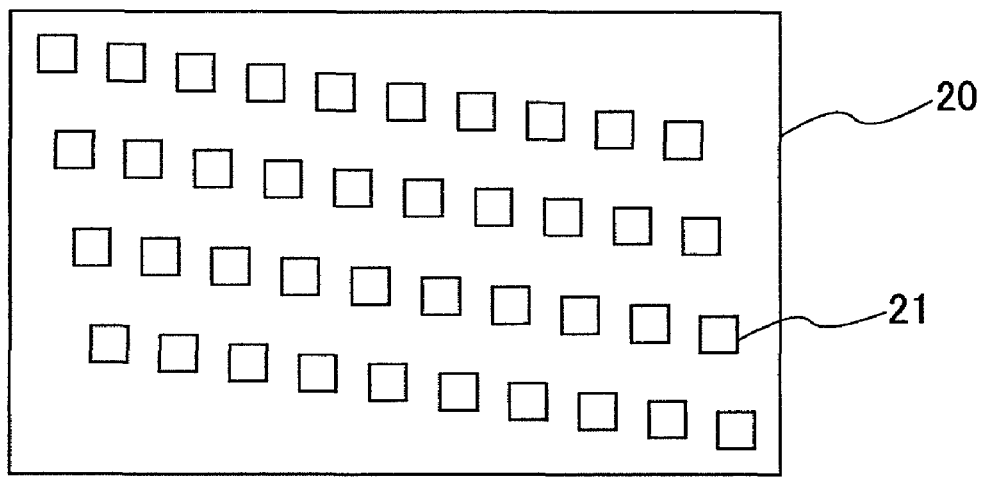
FIG. 12 is a diagram illustrating a light emitting surface of a VCSEL as an example of a multibeam array.

For example, the beam splitter 4 of FIG. 8 is a half mirror, which splits the light intensity equally into halves for the upper portion 1a and the lower portion 1b of the polygon mirror 1. Thus, during writing by the lower portion 1b, the light for the upper portion 1a is blocked by a blocking member and is not used.

According to this embodiment of the present invention, because the optical path of the light emitted from the polarization bistable VCSEL 20 is switched to the upper portion 1a or the lower portion 1b by the optical path switching unit 14 and is reflected to the corresponding scanning surface, the light is efficiently used.

Because the optical path is switched in this way, it is possible to provide light having a light intensity twice the light intensity of light in the related-art device and to write at a speed twice the speed of the related-art device.

If the light intensity is already high enough, the intensity of the emission light from the polarization bistable VCSEL 20 can be reduced by half, resulting in improved reliability of the VCSEL.

FIG. 6 is a schematic diagram illustrating an optical scanning device using an optical path switching device.

In FIG. 6, reference numerals 41 and 41' denote semiconductor lasers (laser light sources); 43 and 43' denote coupling lenses; 44 denotes an optical path switching unit or a pair of a polarization switching unit and a polarization splitting unit; 45a and 45b denote cylindrical lenses; 47 denotes a polygon mirror as a polarization unit; 48a, 48b, 50a, and 50b denote scanning lenses (fθ lenses); 49 denotes mirrors; and 51a, 51b denote photoreceptors.

Two such optical scanning devices may be used to form an image forming apparatus. The polygon mirror 47 is expensive, and therefore the optical image forming apparatus may include one polygon mirror 47 in place of two polygon mirrors 47.

More specifically, two optical systems (optical systems 1, each including two laser light sources (two LD units) 41 and 41' through cylindrical lenses 45a and 45b located at the subsequent stage of the optical path switching unit 44 or the pair 44 of the polarization switching unit and the polarization splitting unit; two imaging optical systems (optical systems 2), each including fθ lenses 48a, 48b, 50a and 50b; and one two-stage polygon mirror 47 may form an optical scanning device that writes four optical scanning positions using two beams. The optical scanning is performed on four photoreceptors for four colors (cyan, yellow, magenta, and black). Thus a multicolor image forming apparatus can be formed.

In this case, a pair of the optical systems 1 and 2 and another pair of the optical systems 1 and 2 are disposed at the opposite sides of the two-stage polygon mirror 47 so that the two pairs scan the corresponding photoreceptors in the opposite directions.

Two laser beams (two beams) are emitted respectively from the two laser light sources 41 and 41' and become incident on an upper portion 47a and a lower portion 47b, respectively, of the two-stage polygon mirror 47 at the same time. The optical path switching unit 44 offers a function of switching the two beams between the upward direction and the downward direction. In this example, the optical path switching unit 44 switches the two beams. However, in the case where the VCSEL 20 is used, the optical path switching unit 44 switches laser lights of multiple beams at the same time.

Figure 7:
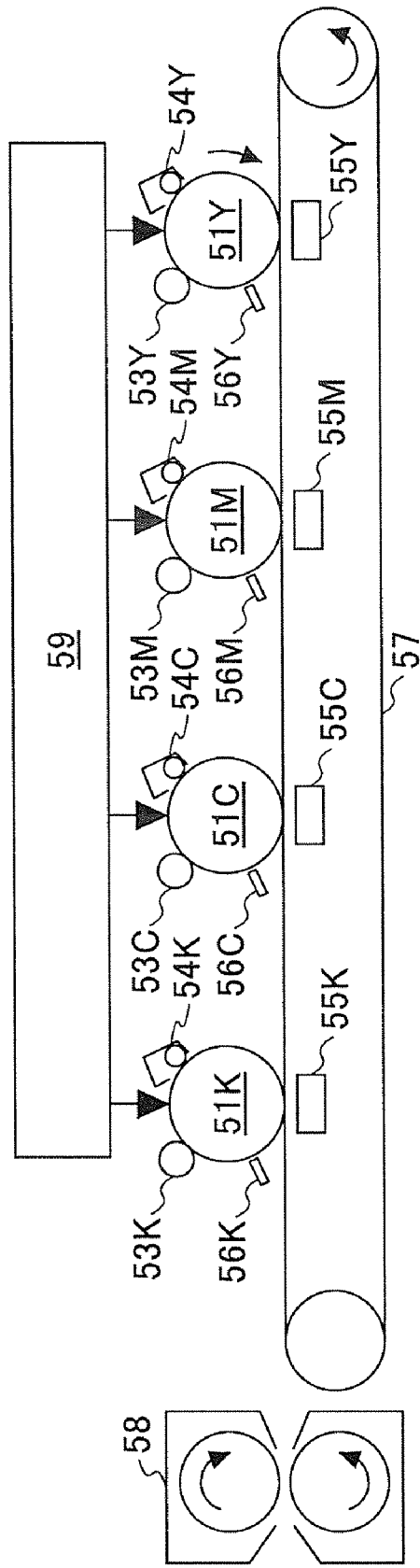
FIG. 7 is a diagram schematically illustrating a configuration of a tandem type full-color image forming apparatus.

FIG. 7 is a diagram schematically illustrating a configuration of a tandem type full-color image forming apparatus.

FIG. 7, shows charging units, developing units, charging units for transfer, cleaning units, a transfer belt, a fixing unit, and a writing unit (optical scanning unit).

Photoreceptors 51Y, 51M, 51C, and 51K rotate in the direction of the arrow. The charging units 53Y, 53M, 53C, and 53K, the developing units 54Y, 54M, 54C, and 54K, the charging units for transfer 55Y, 55M, 55C, and 55K, and the cleaning units 56Y, 56M, 56C, and 56K are disposed in this order in the rotating direction of the photoreceptors 51Y, 51M, 51C, and 51K, respectively.

The charging units 53Y, 53M, 53C, and 53K uniformly charge the surfaces of the photoreceptors 51Y, 51M, 51C, and 51K, respectively. The writing unit 59 irradiates beams onto the surfaces of the photoreceptors 51Y, 51M, 51C, and 51K between the charging units 53Y, 53M, 53C, and 53K and the developing units 54Y, 54M, 54C, and 54K to form electrostatic latent images on the photoreceptors 51Y, 51M, 51C, and 51K. Then, the developing units 54Y, 54M, 54C, and 54K form toner images on the surfaces of the photoreceptors 51Y, 51M, 51C, and 51K, respectively, based on the electrostatic latent images. Then the charging units for transfer 55Y, 55M, 55C, and 55K transfer the corresponding color toner images onto a recording sheet P. Finally, the fixing unit 58 fixes the images onto the recording sheet P.

According to an image forming apparatus using the above-described optical path switching device capable of switching the optical path laser by controlling the incident laser light, it is possible to sequentially scan and record photoreceptors of different colors by switching the optical path of the writing laser light in response to scanning/recording operations of the multiple-stage polygonal reflector, reduce the number of light sources, and prevent beam power loss, and enable high-speed image output by high-speed optical path switching.

In the case where a two-stage polygon mirror is used in the four drum tandem type apparatus as shown in FIGS. 6 and 7, it is possible to sequentially and alternately scan a pair of, for example, yellow and magenta photoreceptors and a pair of, for example, cyan and black photoreceptors.

The present application is based on Japanese Priority Application No. 2007-245223 filed on Sep. 21, 2007, with the Japanese Patent Office, the entire contents of which are hereby incorporated herein by reference.

What is claimed is:

1. An optical path switching device, comprising:
   a polarization bistable VCSEL that emits a beam having a rising polarization plane;
   a laser light source configured to emit a beam having a polarization plane orthogonal to the rising polarization plane; and
   an optical path switching unit configured to switch an optical path of the beam emitted from the polarization bistable VCSEL by switching an angle of the rising polarization plane of the beam emitted from the polarization bistable VCSEL;
   wherein the beam emitted from the polarization bistable VCSEL is incident on an entrance window of the optical path switching unit; and
   wherein the beam emitted from the laser light source is incident on an exit window of the polarization bistable VCSEL.

2. The optical path switching device as claimed in claim 1, wherein an external resonator type semiconductor laser light source is used as the laser light source.

3. The optical path switching device as claimed in claim 1, wherein the laser light source includes a high-frequency superposing circuit as a drive circuit of the laser light source.

4. The optical path switching device as claimed in claim 1, wherein a half mirror prism is disposed on a first optical axis of the beam emitted from the polarization bistable VCSEL;
   wherein an optical axis of the laser light source is aligned with a second optical path crossing at right angles to the first optical axis of the beam emitted from the polarization bistable VCSEL on a half mirror surface of the half mirror prism; and
   the beam emitted from the laser light source is incident on the polarization bistable VCSEL via the half mirror prism.

5. The optical path switching device as claimed in claim 1, wherein the polarization bistable VCSEL includes light emitting points arranged in multiple arrays.

6. The optical path switching device as claimed in claim 1, wherein a collimator lens is disposed in front of the polarization bistable VCSEL and is configured to substantially collimate the beam emitted from the polarization bistable VCSEL.

7. An optical scanning device, comprising:
   the optical path switching device of claim 1;
   a two-stage polygonal reflector; and
   two scanning surfaces that are alternately scanned.

8. An image forming apparatus, comprising:
   two optical scanning devices of claim 7;
   four sets of a charging unit, a developing unit, and a transfer unit corresponding to the four scanning surfaces; and
   a fixing unit;
   wherein the four scanning surfaces are four photoreceptors; and
   wherein images are formed on the four scanning surfaces.

9. An image forming apparatus, comprising:
   the two optical path switching devices of claim 1;
   a two-stage polygonal reflector;
   four photoreceptors as four scanning surfaces;
   four sets of a charging unit, a developing unit, and a transfer unit corresponding to the four photoreceptors; and
   a fixing unit.

* * * * *